United States Patent
Dunn et al.

(10) Patent No.: US 7,079,373 B2
(45) Date of Patent: Jul. 18, 2006

(54) DIELECTRIC SHEET, METHOD FOR FABRICATING THE DIELECTRIC SHEET, PRINTED CIRCUIT AND PATCH ANTENNA USING THE DIELECTRIC SHEET, AND METHOD FOR FABRICATING THE PRINTED CIRCUIT

(75) Inventors: Gregory J. Dunn, Arlington Heights, IL (US); Jeffrey M. Petsinger, Wayne, IL (US); Jovica Savic, Downers Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 17 days.

(21) Appl. No.: 10/837,461

(22) Filed: Apr. 30, 2004

(65) Prior Publication Data

US 2005/0242997 A1    Nov. 3, 2005

(51) Int. Cl.
*H01G 4/06* (2006.01)
*H05K 1/11* (2006.01)

(52) U.S. Cl. ............. 361/311; 361/793; 361/321.2
(58) Field of Classification Search ......... 361/33–313, 361/761–766, 793, 321.2, 322; 257/669, 257/296; 428/615; 429/209
See application file for complete search history.

(56) References Cited

U.S. PATENT DOCUMENTS

| 6,120,693 A * | 9/2000 | Petti et al. .................... 216/18 |
| 6,606,793 B1 * | 8/2003 | Dunn .......................... 29/853 |
| 2005/0079375 A1 * | 4/2005 | Dean et al. ................. 428/615 |
| 2005/0135074 A1 * | 6/2005 | Dunn et al. ................. 361/763 |

\* cited by examiner

Primary Examiner—Eric W. Thomas

(57) ABSTRACT

A dielectric sheet (500, 600, 1621) includes a photodielectric support layer (505, 1630) that may be glass reinforced and a dielectric laminate (510, 605). The dielectric laminate includes first and second metal foil layers (415, 660; 210, 665, 1605, 1610), and a dielectric layer (405, 655, 1620) disposed between the first and second metal foil layers. The first metal foil layer is adhered to the photodielectric support layer. In a printed circuit and patch antenna that includes the dielectric sheet, the first metal layer is patterned by removal of metal according to a circuit pattern and the photodielectric support layer is patterned by removal of dielectric material according to the circuit pattern.

12 Claims, 7 Drawing Sheets

600

DIELECTRIC SHEET, METHOD FOR FABRICATING THE DIELECTRIC SHEET, PRINTED CIRCUIT AND PATCH ANTENNA USING THE DIELECTRIC SHEET, AND METHOD FOR FABRICATING THE PRINTED CIRCUIT

FIELD OF THE INVENTION

The present invention generally relates to capacitors that are integrated or embedded in rigid or flexible single or multilayer circuit boards.

BACKGROUND

In the electronics art, smaller often means better. In the quest to provide smaller electronic appliances, the electronics industry seeks electronic components that are smaller than predecessor components.

The capacitor (a dielectric material sandwiched between two conductors) represents one electronic component that has substantially shrunk in this quest. However, current practice relies largely on individually mounting and soldering each capacitor onto the surface of circuit boards. Despite the advances in capacitor miniaturization, each surface mounted capacitor still occupies a significant fraction of the circuit board surface area, and requires substantial cost to "pick and place" onto the board. For example, a typical cellular phone contains over 200 surface mounted capacitors connected to circuit boards by over 400 solder joints. The ability to integrate or embed capacitors in circuit boards during manufacture of the circuit boards would provide substantial space and cost savings over surface mounted capacitors. Unfortunately, efforts to make capacitors that can be integrated or embedded into circuit boards have either produced capacitors that do not have sufficient capacitance (e.g. <10 $pF/mm^2$) to replace many of the capacitors (e.g., requiring >100 pF capacitance) on a circuit board, or have resulted in structures and processes that have not been scaled up to manufacturing volumes.

Printed circuit structures typically comprise multiple layers of copper and glass-reinforced epoxy or other polymer. The copper is patterned to form the conducting elements of the circuit, and the polymer provides dielectric isolation and mechanical robustness. Polymers are low dielectric constant materials, and therefore parallel plate embedded capacitors formed within the polymer dielectric circuit board do not offer high capacitance density. One known technique to raise the dielectric constant above that of polymer is to form a dielectric layer from a polymer layer loaded with a high permittivity ceramic powder (such as barium titanate). Such dielectric layers achieve a capacitive density that is on the order of 10 to 20 $pF/mm^2$.

Although ceramic dielectrics that have very high dielectric constants are available, they are typically too rigid to be mechanically compatible with organic printed circuit structures. Further, organic printed circuit structures are incompatible with the methods used to form the ceramic dielectric films. Thin film ceramic dielectric films are commonly formed by a broad range of deposition techniques, such as chemical solution deposition (CSD), evaporation, sputtering, physical vapor deposition and chemical vapor deposition. However, in order to achieve the requisite dielectric structure, such techniques typically require either a high-temperature deposition or a high-temperature crystallization. Such temperatures would melt, ignite or otherwise degrade the organic materials in the circuit board substrate. Furthermore, these processes are incompatible with copper in two ways. First, at the high temperatures and oxidizing conditions needed to form the ceramic dielectric, copper forms a thin layer of copper oxide at the interface between the ceramic dielectric and the copper. This effectively forms an interface layer which will degrade the overall device performance, thus negating any advantage gained by the use of the ceramic dielectric. Second, the reducing atmosphere favored by copper produces excessive defect concentrations and may frustrate phase formation in the dielectric oxide layer. Efforts to form ceramic films at temperatures that are compatible with circuit board components have generally compromised the dielectric properties of the resulting ceramic. For ceramic dielectrics, it is apparent that favorable dielectric properties are intimately linked to a complex crystal structure (e.g., perovskite) that is difficult to develop at lower temperatures.

Dielectric oxides such as lead zirconate titanate (PZT) and lead lanthanum zirconate titanate (PLZT) belong to a particularly promising class of high permittivity ceramic dielectrics with the perovskite crystal structure. When formed by the CSD process, dielectric oxides can be made into very thin, flexible, robust layers with very high dielectric constants.

Several methods have been proposed to create a thin structure that is intended to be added to a circuit board using compatible circuit board layering techniques, by adding a thin coating of dielectric oxide to a thin foil of copper. Although some aspects of how such a structure would be manufactured, integrated into a circuit board structure, and patterned have been described, improvements that use these methods for a wide variety of applications are desirable.

What is needed is a structure and process for adding capacitors formed of high dielectric constant materials to rigid or flexible circuit boards that are economical to manufacture and wherein the structure is in a form compatible with multilayer circuit board stacking techniques that are in wide use today.

BRIEF DESCRIPTION OF THE DRAWINGS

The present invention is illustrated by way of example and not limitation in the accompanying figures, in which like references indicate similar elements, and in which.

Figure 1:
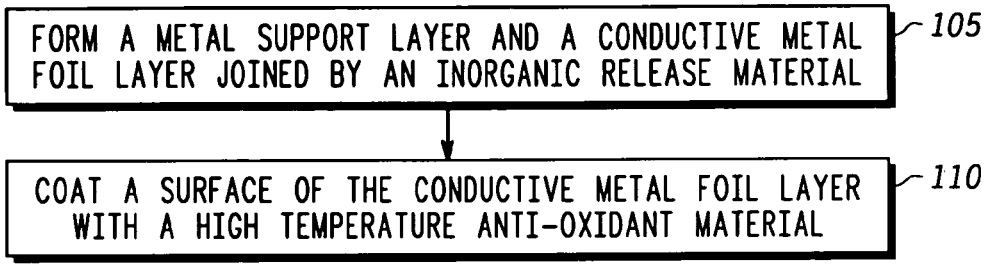
FIG. 1 is a flow chart that shows a method for fabricating a peelable circuit board foil in accordance with an embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Before describing in detail the particular printed circuit embedded capacitors in accordance with the present invention, it should be observed that the present invention resides primarily in combinations of method steps and apparatus components related to embedded capacitors for circuit boards. Accordingly, the apparatus components and method steps have been represented where appropriate by conventional symbols in the drawings, showing only those specific details that are pertinent to understanding the present invention so as not to obscure the disclosure with details that will be readily apparent to those of ordinary skill in the art having the benefit of the description herein.

The embedded capacitors of the present invention may be formed from a unique dielectric sheet that is applied to a sub-structure of a printed circuit structure that when completed comprises at least two substrate layers. The fabrication of the completed printed circuit structure including the embedded capacitors of the present invention is compatible with conventional printed circuit structure fabrication techniques. The unique capacitive sheet comprises a capacitive laminate that is a dielectric layer between two metal layers, wherein the dielectric layer is typically less than 100 microns in thickness. In some embodiments, the dielectric layer is a polymer loaded with high permittivity ceramic powder, and in others it is a crystallized dielectric oxide. The capacitive sheet structure provides at least two advantages: it forms a structure that can be handled reliably using conventional printed circuit fabrication procedures, and it allows for patterning of the side of the sheet that is adhered to a partially fabricated multi-layer printed circuit structure. The ability to pattern the side that is adhered to a partially fabricated multi-layer printed circuit structure permits a variety of types of interconnections to be made to both sides of the metal layers (electrodes) of the capacitive sheet. Furthermore, in the embodiment that comprises a dielectric layer formed of crystallized dielectric oxide, the capacitive sheet is compatible with printed circuit materials that would typically be substantially degraded if attempts to crystallize the dielectric materials were performed in situ on the printed circuit sub-structure itself. The embodiments of the present invention are compatible with commonly used printed circuits that need only withstand the processes typically used for printed circuit soldering. For example, the embodiments of the present invention that have a dielectric layer that is a crystallized dielectric oxide are fully compatible with the printed circuit material known as FR-4, which passes a 10 second solder dip test at 288 degrees Centigrade and has a degradation temperature of 300 degrees Centigrade. Moreover, these embodiments of the present invention are fully compatible with printed circuit materials such as FR-4 that typically have a surface roughness on the order of microns, and is therefore distinguished from prior art techniques, especially those involving vacuum deposition of thin (<1 micron) films on polymers such as Teflon and polyimide that, while offering higher temperature compatibility and smoother surfaces, are more expensive than FR-4 and substantially more difficult to metallize and process.

As mentioned above, some embodiments of the present invention involve the use of a unique capacitive sheet that is applied to the printed circuit sub-structure after a thin layer of dielectric oxide is applied to a metal foil layer and then crystallized, at temperatures up to 600 degrees Centigrade to form a capacitive laminate that is a component of the capacitive sheet. One method of fabricating such a foil is described in some detail with reference to FIGS. 1–4 below; other methods could be used. One example of another method is described in U.S. Publication 2003/0113443A1, published on Jun. 19, 2003. While the electrodes formed by the methods described with reference to FIGS. 1–4 are relatively thin (on the order of 25 microns or less), other methods could result in a foil having a thickness of at least one electrode layer that is up to approximately 70 microns.

Figure 2:
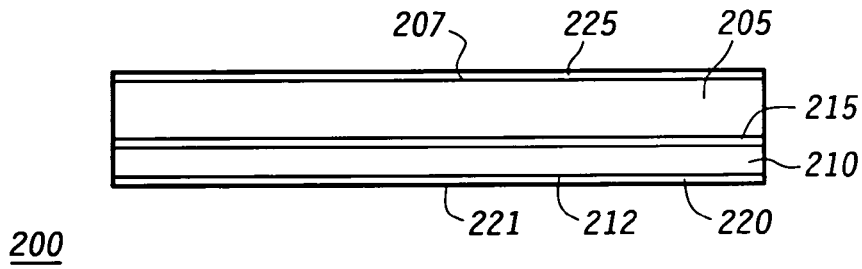
FIG. 2 is a cross section diagram of the peelable circuit board foil fabricated by the method described with reference to FIG. 1.

Referring to FIG. 1, a method for fabricating a peelable circuit board foil 200 is shown, in accordance with an embodiment of the present invention. A cross sectional view of the peelable circuit board foil 200 is shown in FIG. 2. At step 105 (FIG. 1) a metal support layer 205 (FIG. 2) and a conductive metal foil 210 (FIG. 2) are formed that are joined at first surfaces using an inorganic release material 215 (FIG. 2). This inorganic release material 215 retains its ability to separate the two metal layers 205, 210 after exposure to high temperatures (used to add a crystallized dielectric layer to the peelable circuit board foil 200, as described below with reference to FIGS. 3 and 4). The inorganic release material consists essentially of a co-deposited admixture of a metal and a non-metal, and may be formed using known techniques such as those described in U.S. Pat. No. 6,346,335,B1 issued to Chen et al. on Feb. 12, 2002. In accordance with this embodiment of the present invention, the metal support layer 205 may be between 10 and 75 microns thick, and for most uses is between 30 and 70 microns thick; the conductive metal foil 210 may be between 5 and 25 microns thick and for most uses is between 10 and 20 microns thick; and the inorganic release material may be less than 0.030 microns thick. Because the present invention is for fabrication of a dielectric foil (and, ultimately, the formation of capacitors in a layer or layers of multi-layer printed circuit structures), the conductive metal foil 210 of the present invention is normally thicker than that used for conventional metal foils having a release layer (for example, see U.S. Pat. No. 6,346,335). The optimum metal for the metal support layer 205 and the conductive metal foil 210 for most applications is copper or a copper alloy, but other metals such as nickel or a nickel alloy could be used.

At step 110 (FIG. 1), a second surface 212 of the metal foil layer 210 may be coated with a high temperature anti-oxidant barrier 220 (FIG. 2), and the resulting coated second surface (221) has a surface roughness less than 0.05 micron root mean square (RMS). The high temperature anti-oxidant barrier 220 is one that is effective to prevent any substantial oxidation of the conductive metal foil 210 during a later step in which a dielectric oxide is applied, pyrolyzed, and crystallized by known techniques, at temperatures as high as about 600 degrees centigrade, and has performance benefits compared to typical anti-tarnish coatings used for conventional peelable circuit board foils that perform well at temperatures below 100 degrees centigrade.

This high temperature anti-oxidant barrier may be deposited on the conductive metal foil 210 by sputtering, electroless plating or electrolytic plating materials that may be selected from palladium, platinum, iridium, nickel, or alloys or compositions that include any combination of these metals with other materials, for example, minor amounts of aluminum or other materials, using known techniques that will achieve a surface roughness of less than 0.05 micron RMS, and which will typically achieve a surface roughness less than 0.01 micron RMS.

Electroless or electrolytic nickel phosphorus is useful as the high temperature anti-oxidant in many applications. The phosphorous content of the nickel-phosphorous generally ranges from about 1 to about 40 wt % phosphorous, more specifically about 4–11 wt % and even more specifically about 6–9 wt %. Typically, the technique chosen to coat the conductive metal foil layer 210 will result in a second surface 207 (FIG. 2) of the metal support layer 205 also being coated with the same high temperature anti-oxidant barrier 225 (FIG. 2) to about the same thickness, but this is not a required result for the present invention. For example, an acceptable alternative technique would comprise masking the second surface of the metal support layer 205 with a resist or other polymer material during the plating step so that the high temperature anti-oxidant barrier is applied to only the conductive metal foil 210, leaving the metal support layer 205 uncoated. In contrast to conventional peelable circuit board foils, for example the CopperBond® Thin Copper Foil distributed by Olin Corporation Metals Group of Waterbury, Conn., for which the exposed surface of the conductive metal foil may be intentionally roughened by a dendrite forming process, the resulting surface of the conductive metal foil 210 of the present invention is kept smooth, with a roughness measurement less than 0.05 microns root mean square (RMS), and more preferably less than 0.01 micron RMS. Such smoothness can be achieved by known techniques that are used to form the conductive metal foil 210 and the high-temperature anti-oxidant barrier 220. The peelable circuit board foil 200 formed by the method described with reference to FIG. 1 is conveniently able to be made in sizes commensurate with conventional printed circuit structures and handled and shipped without having to use expensive techniques to protect it from wrinkling or tearing during shipment, handling, and processing.

Figure 3:
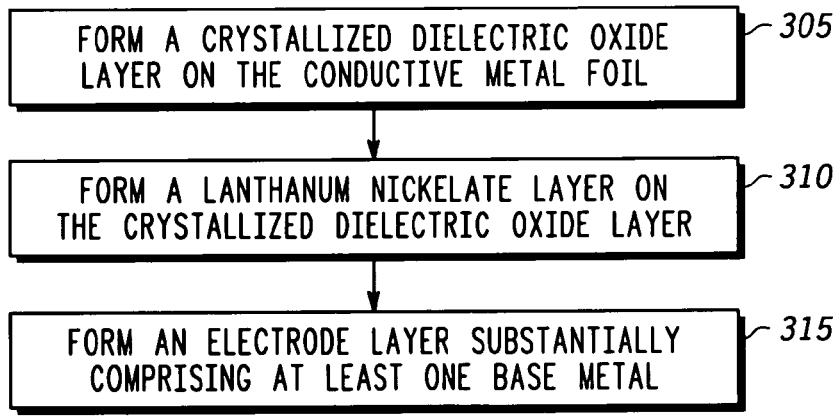
FIG. 3 is a flow chart that shows a method for fabricating a peelable circuit board foil in accordance with an embodiment of the present invention.
Figure 4:
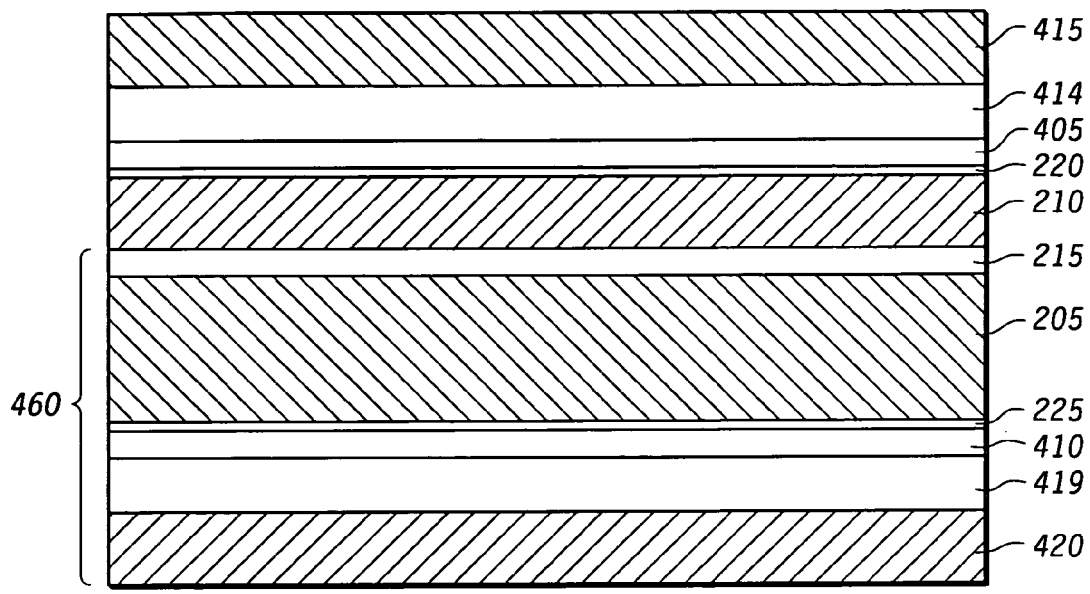
FIG. 4 is a cross section diagram of a portion of the peelable circuit board foil fabricated by the method described with reference to FIG. 3.

Referring now to FIG. 3, a method for fabricating a dielectric peelable circuit board foil 400 from the peelable circuit board foil 200 is shown, in accordance with an embodiment of the present invention. A cross sectional view of a portion of the dielectric peelable circuit board foil 400 is shown in FIG. 4. At step 305, a crystallized dielectric oxide layer 405 (FIG. 4) is formed adjacent to the conductive metal foil 210 of a peelable circuit board foil 200. Specific examples of the crystallized dielectric oxide according to this invention include lead zirconate titanate (PZT), lead lanthanide zirconate titanate (PLZT), lead calcium zirconate titanate (PCZT), lead lanthanide titanate (PLT), lead titanate (PT), lead zirconate (PZ), lead magnesium niobate (PMN), barium titanate (BTO) and barium strontium titanate (BSTO). Lead based dielectric oxides comprising the PZT system, particularly compositions comprising the PCZT formula $PbCa_x(ZrO_{0.52}Ti_{0.48})O_3$, where x is from 0.01 to 0.1, are particularly attractive. The addition of small quantities of elements such as Ni, Nb, Ca and Sr in compounds that do not specifically name them can also improve electrical performance. Accordingly, the dielectric oxides of the present invention may also contain small quantities of Ni, Nb, Ca and Sr.

The crystallized dielectric oxide is formed at step 305 by one of a broad range of deposition techniques, such as chemical solution deposition (CSD), evaporation, sputtering, physical vapor deposition and chemical vapor deposition. These techniques typically require either a high-temperature deposition or a high-temperature crystallization, and result in a crystalline coating on the conductive metal foil 210 that is polycrystalline in form and quite flexible, while maintaining excellent dielectric properties for forming capacitors even when flexed. An economical, well known technique that can be used for forming the crystalline dielectric oxide layer is to use CSD. Another economical technique for forming the crystalline dielectric oxide layer is powder coating using a powder or powder suspension. The crystallized dielectric oxide material formed by these techniques is most often of a polycrystalline nature, as is well known in the art. The crystallized dielectric oxide layer 405 may be formed with a thickness from about 0.1 to about 1 micron. When the crystallized dielectric oxide layer 405 is PCZT, it may be formed to be 0.2–0.6 micron thick for many uses, and will provide capacitance densities that exceed 1000 picoFarad per square millimeter (1000 $pF/mm^2$), and that are typically 3000 $pF/mm^2$ or more, while still providing high production yields and necessary breakdown voltages (e.g., greater than 5 volts). When the crystallized dielectric layer is formed by the cost effective methods of CSD or powder coating at thicknesses less than 0.2 microns thick, defects tend to arise in the form of pinhole shorts between the conductive metal foil 210 and an electrode layer 415 that is added in a later step. Other techniques, such as sputtering, may allow thinner crystallized dielectric oxide layers, but they are much less economical and the layer may be too thin to withstand handling. The dip coating technique and other techniques may also result in the formation of a sacrificial crystallized dielectric oxide layer 410 adjacent the metal support layer 205, but this layer is not required for the present invention. For some coating techniques, allowing the formation of the sacrificial crystallized dielectric oxide layer 410 on the metal support layer 205 is projected to be less costly than attempting to prevent its formation, and serves to reduce curling of the foil layer that may result when only the crystallized dielectric oxide layer 405 is formed.

The peelable circuit board foil 400 formed by the method described with reference to step 305 of FIG. 3 can be conveniently made in sizes commensurate with conventional printed circuit structures and handled and shipped without having to use expensive techniques to protect it from wrinkling or tearing during shipment, handling, and processing. This peelable circuit board foil 400 can then be used to apply the dielectric layer 405 and the conductive metal foil layer 210 within (or on) a flexible or rigid printed circuit structure stack to form capacitors having different dielectric areas. This is done by adhering the dielectric layer 405 of the peelable circuit board foil 400 to a conductive metal layer surface of a flexible or rigid printed circuit structure stack using an appropriate conductive adhesive material or other known technique, then peeling away the metal support layer 205, the sacrificial crystallized dielectric oxide layer 410, and the high temperature anti-oxidant barrier 225 as indicated by the portion 460 in FIG. 4, followed by well known etching and metal deposition steps that form individual capacitors. In one embodiment, a single capacitor is formed within an entire layer of the printed circuit structure, such as for a power source layer.

Referring again to FIGS. 3 and 4, at step 310 (FIG. 3), a lanthanum nickelate (LNO) layer 414, which is a conductive perovskite material, is formed on the crystallized dielectric oxide layer 405. An economical method of forming the LNO layer 414 is to use chemical solution deposition (CSD). The LNO layer 414 may be formed to be between 0.05 and 5 microns thick under most circumstances, and between 0.5 and 2 microns for many circumstances. As noted above, CSD may also be used to form the crystallized dielectric oxide layer 405. When CSD is used to form both layers 405, 414, the layers can be co-fired, which may further reduce processing steps and fabrication costs. Depending on the technique used to form the LNO layer 414, a sacrificial LNO layer 419 may also be formed on the sacrificial crystallized dielectric oxide layer 410 (if present), or on the sacrificial high temperature anti-oxidant barrier 225 (if present), or on the metal support layer 205. Following the formation of the LNO layer 414, an electrode layer 415 is formed at step 315 on the LNO layer 414 (i.e., on the exposed surface of the LNO layer 414), using a well known technique such as sputtering or electroless plating or electrolytic plating. The electrode layer 415 substantially comprises one or more base metals; i.e., it is formed of a base metal or an alloy of base metals, which may include trace amounts (less than 1%) of other metals or elements. The base metals include at least iron, cobalt, nickel, copper, and zinc. A typical thickness for the electrode layer 415 is 2 to 20 microns. Depending on the technique used to apply the electrode layer 415, a sacrificial electrode layer 420 of approximately the same thickness as the electrode layer 415 may also be formed, adjacent the sacrificial crystallized dielectric oxide layer 410 on the metal support layer 205 (i.e., on the surface of the crystallized dielectric layer that is opposite the metal support layer 205), but this is not required for the present invention. The combination of the electrode layer 415 over the LNO layer 414 on the crystallized dielectric oxide 405, wherein the electrode layer substantially comprises one or more base metals, provides advantages over other techniques for forming an electrode layer overlying a crystallized dielectric oxide layer. One advantage is that it allows the formation of the electrode layer using the electrolytic plating method for many base metal compositions, which is a very economical technique to deposit the metal layer, and for which the materials (base metals) can be very economical (e.g., nickel and copper), particularly in comparison to the deposition of noble metals, such as platinum, over LNO (which has been proposed in other circumstances for other reasons). Another advantage is that it provides an electrode layer that is strongly adhered to the crystallized dielectric oxide layer, using an economical technique that does not require other techniques to achieve moderate or strong adherence (such as doping the dielectric oxide layer to seed the electrode layer, or roughening the crystallized dielectric oxide layer to improve adherence). Yet another advantage is that the base metals can be economically patterned using common photolithographic and etching techniques, using, for example, nitric acid as an etchant.

Figure 5:
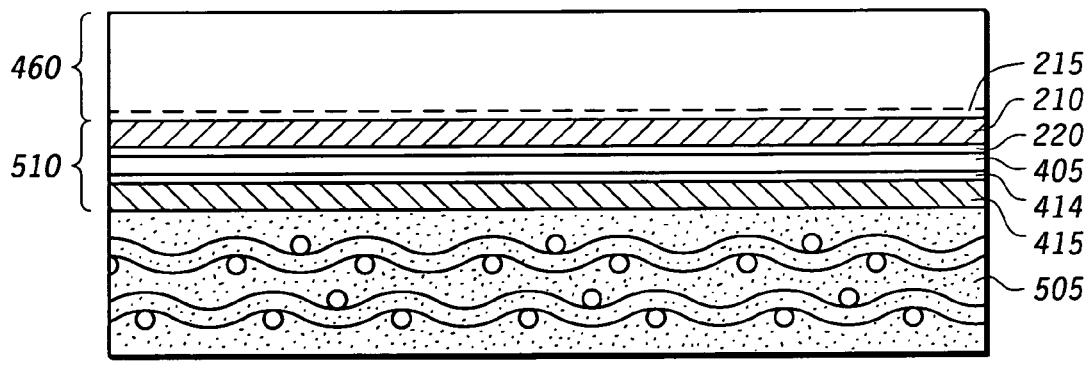
FIG. 5 is a cross section diagram that shows a portion of the peelable circuit board foil after it has been applied to a portion of a photodielectric support layer, in accordance with embodiments of the present invention.

Referring to FIG. 5, a cross section diagram of a portion of the peelable circuit board foil 400 after it has been applied to a portion of a photodielectric support layer 505 is shown, in accordance with embodiments of the present invention. The combined structure is a portion of a capacitive sheet 500. The peelable circuit board foil 400 comprises what is termed herein a capacitive laminate 510 formed by disposing the crystallized dielectric oxide layer 405 between the electrode layer 415 and the conductive metal foil layer 210 which are referred to hereafter (respectively) as a dielectric layer 405, a first metal foil layer 415 and a second metal foil layer 210. It should be appreciated that "being disposed between", or simply "being between" "the first and second metal foil layers" as used throughout this document means that the dielectric layer 405, 655 is adhered to the first and second metal foil layers 415, 210 with intermediate materials optionally disposed between the dielectric layer and the first and second metal foil layers, wherein the intermediate materials are typically used to achieve the adherence and/or improve the desirable characteristics of the dielectric and metal foil layers. The high temperature anti-oxidant and LNO described above are just two examples of such intermediate materials. The photodielectric support layer 505 and the capacitive laminate 510 may either made by the entity forming the capacitive sheet 500, or either or both of them may be obtained by that entity from a supplier. The photodielectric support layer 505 is a thin layer (preferably less than 260 microns thick, and preferably on the order of 25 to 125 microns thick) of glass filled photosensitive polymer (a glass reinforced B-stage photosensitive epoxy layer). In these embodiments, the photodielectric support layer 505 and the peelable circuit board foil 400 (the capacitive laminate) are mated to each other using conventional pressure techniques to form the capacitive sheet 500. The layers of the peelable circuit board foil 400 in FIG. 5 occur in the reverse order, from top-to-bottom, relative to the order in FIG. 4, with the inorganic release layer 215 (a part of the peelable layer 460) being adjacent the conductive metal foil layer 210.

As indicated herein above, other techniques can be used to form a capacitive laminate comprising a crystallized dielectric oxide layer 405 that is between first and second metal foil layers, or a capacitive laminate that comprises a polymer that is loaded with a high permittivity material in powder form that is disposed between first and second metal foil layers. Such foils need not be, and typically are not, of the peelable type described above with reference to FIGS. 1–5. All of these embodiments of a capacitive laminate may be adhered to a photodielectric support layer 505 as described above. When the dielectric laminate has a crystallized dielectric oxide layer, care in handling the resulting foil is needed to avoid undue wrinkling of the foil, and when the dielectric laminate has a powder loaded polymer layer, care in handling the resulting laminate is needed to avoid breakage of the laminate, which is typically brittle. Such handling problems are reduced when the fabricator of the laminate is also the fabricator of the capacitive sheet that includes the photodielectric support layer.

Figure 6:
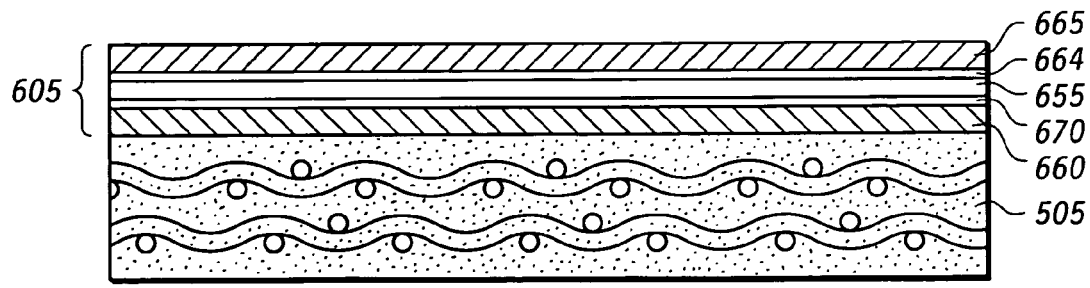
FIG. 6 is a cross-section diagram that shows a portion of a capacitive sheet having a capacitive laminate, in accordance with embodiments of the present invention.

Referring to FIG. 6, a cross-section diagram of a portion of a capacitive sheet 600 having a capacitive laminate 605 is shown, in accordance with embodiments of the present invention. The capacitive laminate 605 comprises a first metal layer 660, a dielectric layer 655, a first intermediate layer 664, a second metal layer 665, and may comprise a second intermediate layer 670. The metal layers 665 may comprise substantially one or more electrically conductive metals. Either exposed surface of the capacitive laminate 605 may be applied to the photodielectric support layer 505, which may be the same as described above with reference to FIG. 5 In other words, either the second metal layer 665 or the first metal layer 660 may be applied to the photodielectric support layer 505.

Figure 7:
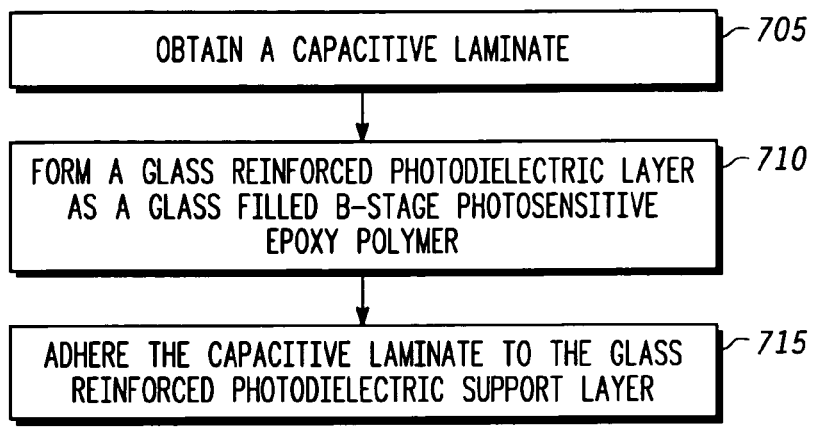
FIGS. 7 and 8 are flow charts of some steps used to form a capacitive sheet, in accordance with embodiments of the present invention.

Referring to FIG. 7, a flow chart of some of the steps described above to form a capacitive sheet 500, 600 is shown, in accordance with embodiments of the present invention. At step 705, a capacitive laminate 510, 605 is obtained, either from a supplier, or by fabricating it. The capacitive laminate 510 may be fabricated as described herein, or the capacitive laminate 605 may be fabricated by conventional techniques. The glass reinforced photodielectric support layer 505 is obtained, either from a supplier or by fabricating it. At step 710 it is formed using conventional techniques, as a glass filled B-stage photosensitive epoxy polymer. The glass reinforced photodielectric support layer 505 and the capacitive laminate 510 or 605 are then adhered to each other at step 715, using conventional pressure techniques. The glass reinforced photodielectric support layer 505 is in a partially cured state (B-stage) that behaves as a glue layer when exposed to temperature and pressure, thereby promoting the adherence of the two structures.

Figure 8:
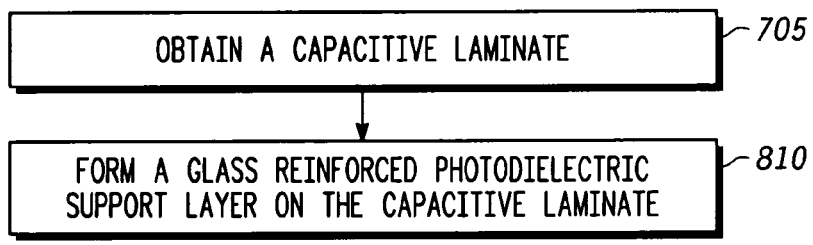

Referring to FIG. 8, a flow chart of some of the steps used in some alternative embodiments to form a capacitive sheet 500, 600 are shown, in accordance with embodiments of the present invention. At step 705, a capacitive laminate 510, 605 is obtained in the manner described above. At step 810, the glass reinforced photodielectric support layer 505 is formed on the capacitive laminate 510, 605 by arranging a glass weave on the capacitive laminate 510, 605 and disposing photosensitive epoxy into the glass weave, using conventional techniques.

Figure 9:
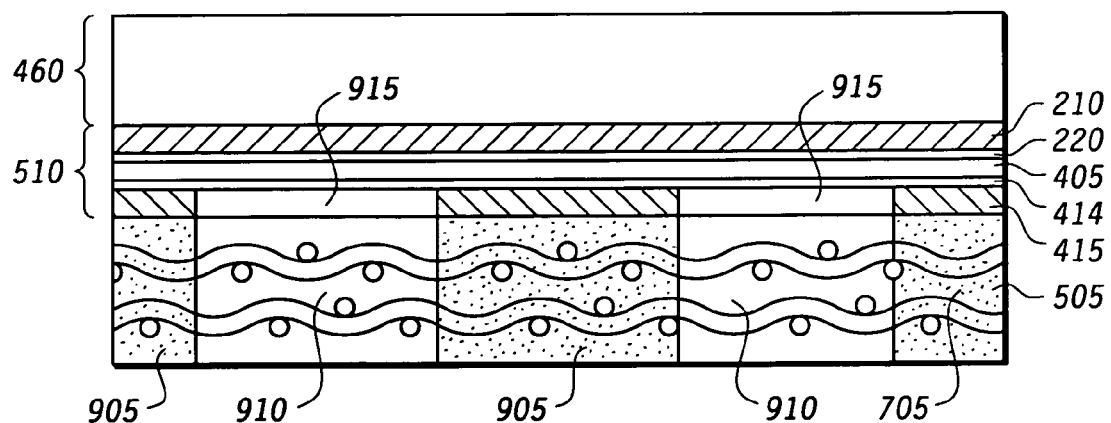
FIGS. 9 and 10 are cross section diagrams that show portions of capacitive sheets after they have been patterned on a glass reinforced side, in accordance with some embodiments of the present invention.
Figure 10:
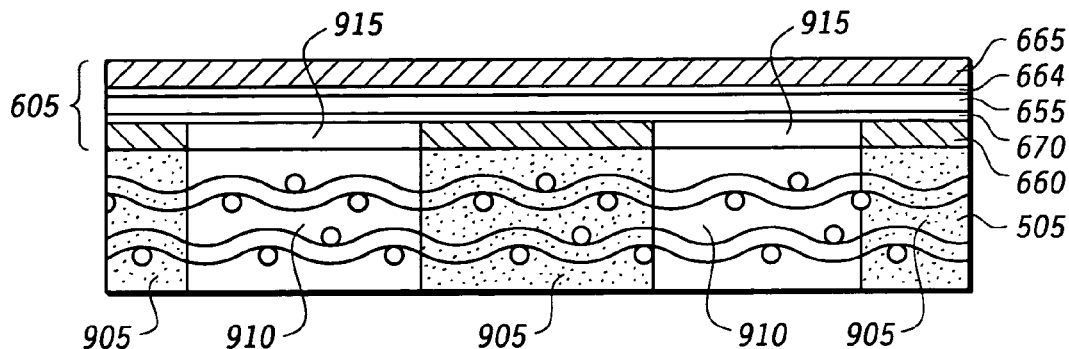
Figure 11:
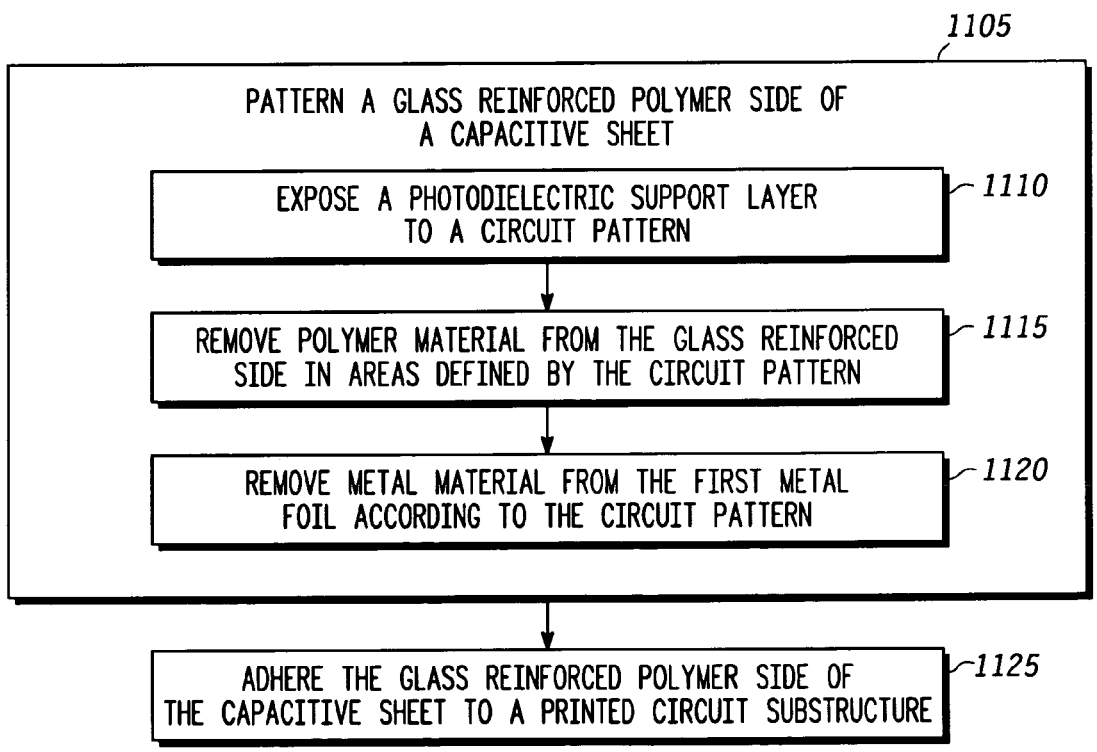
FIG. 11 is a flow chart of some steps used to achieve the patterned capacitive sheets, in accordance with some embodiments of the present invention.

Referring to FIGS. 9 and 10, cross section diagrams of portions of capacitive sheets 500, 600 are shown after they have been patterned on the glass reinforced side 505 (the side having the glass reinforced photodielectric layer 505), in accordance with some embodiments of the present invention. A flow chart of some of the steps used to achieve the patterned capacitive sheets 500, 600 is shown in FIG. 11. At step 1105 the glass reinforced polymer side of the capacitive sheet 500, 600 is patterned by removing polymer and metal according to a circuit pattern. In more detail, this may be accomplished by conventional techniques such as exposing the glass reinforced photodielectric support layer 505 to ultraviolet light using the circuit pattern, which is a photolithographic pattern, at step 1110. For one exemplary photopolymer material (Probelec 7081/7082 polymer, distributed by Huntsman LLC, Los Angeles, Calif.), the capacitive sheet 500, 600 is then thermally bumped for 60 minutes at 110–130 degrees Celsius in either a batch air convection oven or a horizontal air-assist IR oven to complete the photo-reaction and polymerize areas of the glass reinforced side 505 that are not to be removed. The exposed glass reinforced side 505 of the capacitive sheet 500, 600 is then developed at step 1115 to remove polymer material from the patterned areas (unpolymerized areas) 910 (FIGS. 9 and 10) (which may be the positive or negative areas, depending on the choice of photosensitive polymer used for the photodielectric). The glass reinforced side 505 may be solvent developed, for example, using gamma-butyrolactone (GBL) for 20 minutes with ultrasonic agitation. The GBL will remove all un-polymerized material. A curing step may be used at this stage to further harden the polymer material 905 that remains in the photodielectric layer 505, but it may not be necessary in all cases. At step 1120, metal is removed from areas 915 of the first metal foil layer according to the circuit pattern. The first metal foil layer is the layer 415, 660 that is attached to the glass reinforced photodielectric support layer 505. This may be done using conventional metal etching techniques, with the remaining, cured or partially cured polymer 905 of the photodielectric layer 505 acting as an etch resist pattern, and the dielectric layer 405, 655 serving as an etch stop.

At this stage of fabrication, it will be appreciated that the photodielectric support layer still has a glass weave remaining throughout, which retains strength of the capacitive sheet and improves its handling reliability. It will further be appreciated that the glass weave permits the circulation of the photodielectric developer and metal etchant fluids, and that the fiber diameter, weave density, and other characteristics may be designed specifically to optimize these two key properties of strength and permeability.

Figure 12:
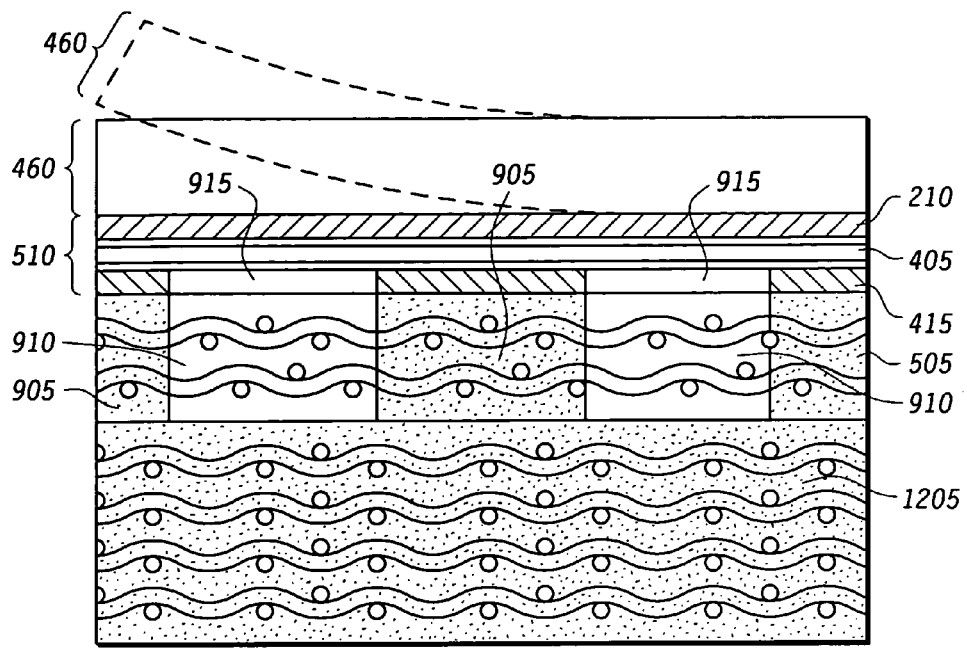
FIG. 12 is a cross section diagram of a portion of a multilayer printed circuit structure in the process of fabrication, in accordance with some embodiments of the present invention.

Referring to FIG. 12, a cross section diagram of a portion of a multilayer printed circuit structure in the process of fabrication is shown, in accordance with some embodiments of the present invention. At step 1125, the glass reinforced side 505 of the capacitive sheet 500, 600 is adhered to a printed circuit substructure, of which a portion of a top layer 1205 is shown. The top layer 1205 is a conventional prepreg layer and the capacitive sheet 500, 600 is adhered using standard temperature and pressure processes. Although FIG. 12 illustrates the capacitive sheet 500, it will be understood that the capacitive sheet 600 is adhered in the same manner. When the capacitive sheet 500 having the capacitive laminate 510 is used, the sacrificial portion 460 of the peelable foil 400 may then be removed, as indicated by the dotted line illustration of the sacrificial portion 460. Alternatively, the sacrificial portion 460 of the peelable foil 400 may be removed after the patterning of the glass reinforced photodielectric side of the capacitive sheet 500 at step 1120, and before the capacitive sheet 500 is adhered to the printed circuit structure. When the metal support layer 205 is peeled away from the conductive metal foil layer 210, the sacrificial electrode layer 420, if present, is also peeled away, as shown by the portion 460 of the peelable circuit board foil 400 in FIGS. 4 and 12 that includes at least the metal support layer 205, and may include other sacrificial materials and layers, such as the inorganic release material 215, the high temperature anti-oxidant barrier 225, the sacrificial crystallized dielectric oxide layer 410, the sacrificial LNO layer 419, and the sacrificial electrode layer 420.

Figure 13:
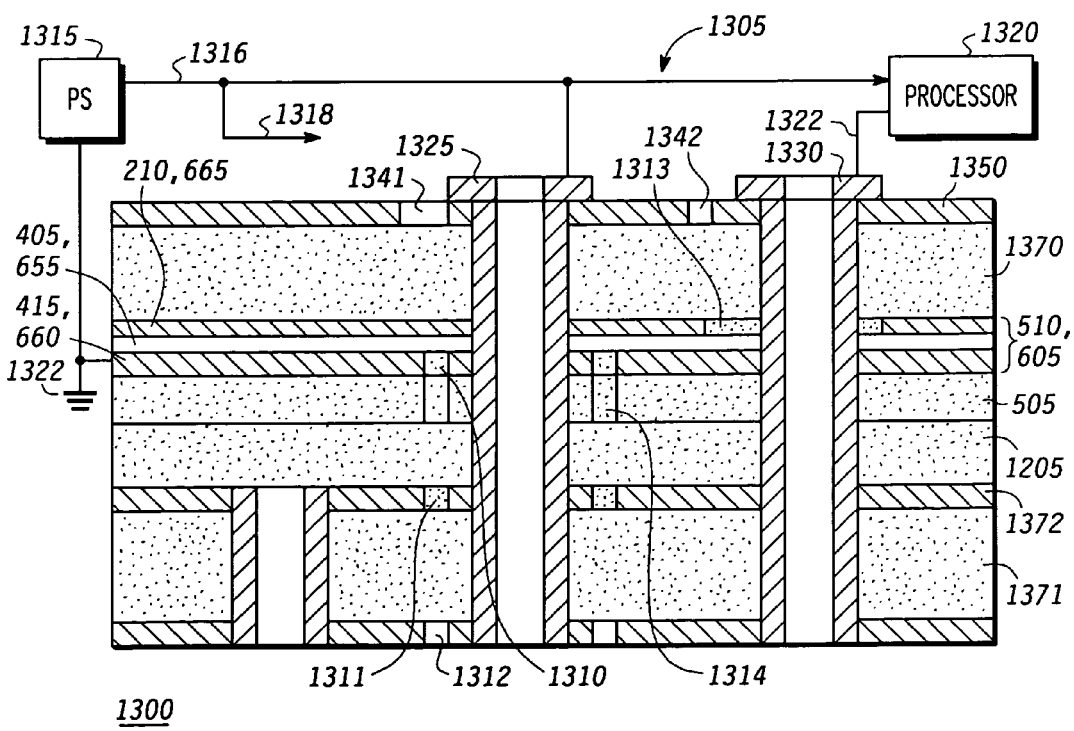
FIG. 13 is a combined cross section diagram of a portion of a multilayer circuit board and a portion of a block diagram of an electronic device, in accordance with some embodiments of the present invention.
Figure 14:
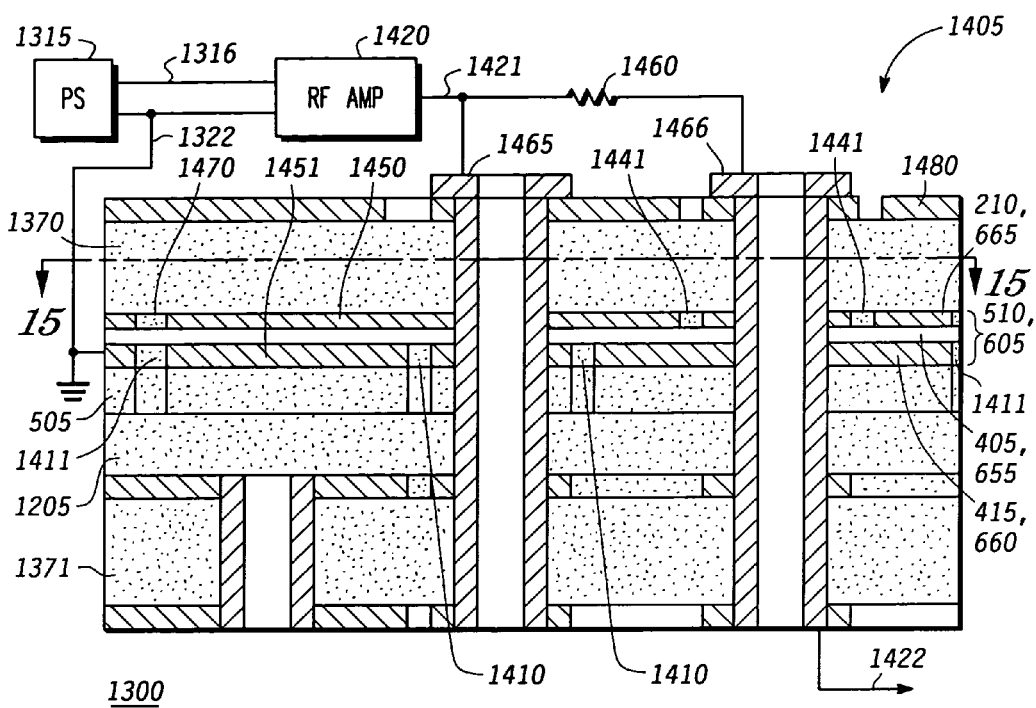
FIG. 14 is a combined cross section diagram of another portion of the multilayer circuit board described with reference to FIG. 13 and a portion of the block diagram of the electronic device, in accordance with some embodiments of the present invention.

Referring to FIG. 13, a combined cross section diagram of a portion 1305 of a multilayer printed circuit structure and a portion of a block diagram of an electronic device 1300 comprising the printed circuit structure is shown, in accordance with some embodiments of the present invention. The portion 1305 of the multilayer circuit board illustrates a capacitive laminate 510, 605 (i.e., either the capacitive laminate 510 or the capacitive laminate 605) formed in accordance with embodiments of the present invention. The capacitive laminate 510, 605 is used in this portion 1305 of the printed circuit structure, as well as significant other portions of the printed circuit structure (not shown in the figures), as a distributed, shared capacitor. A power supply 1315 is coupled to a chassis ground 1322 and provides a DC voltage source 1316 that is coupled to a processor 1320 to supply a portion of the power needed by the processor 1320. The power supply 1315 need not be an integral part of the electronic device 1300. The chassis ground 1322 is coupled to a large portion of the first metal layer 415, 660 of the capacitive laminate 510, 605. The DC voltage 1316 is also coupled by conductors 1318 to other active electronic components of the electronic device 1300, including an RF amplifier (FIG. 14). The shared capacitance is connected to the DC voltage 1316 physically near the processor 1320, at plated through-hole 1325, providing decoupling capacitance primarily for the processor 1320. The processor 1320 is connected to the portion of the capacitive laminate 510, 605 that forms the shared ground layer at plated through-hole 1330. As described above the glass reinforced side 505 of the capacitive sheet and the first metal layer 415, 660 are patterned before the capacitive sheet 500, 600 is adhered to the prepreg layer 1205 of the printed circuit structure. By this means an annulus 1310 is formed around plated through-hole 1325 at the first metal layer to avoid the undesirable connection of the DC voltage 1316 to chassis ground 1320. Other needed annuli 1311, 1312 were formed before the capacitive sheet 500, 600 was adhered to the printed circuit structure. The second metal foil layer 210, 665 is patterned using standard metal patterning techniques after the capacitive sheet 500, 600 is adhered to the partially fabricated printed circuit structure, removing a ring of metal 1313. In some alternative embodiments, the patterning of the second metal foil layer 210, 665 may be done before the capacitive sheet 500, 600 is adhered to the printed circuit structure. Metal 1341, 1342 is removed as needed on the top layer 1350 of the printed circuit structure to isolate and connect circuits, in a conventional manner. The layer of photodielectric material 505 remains a glass filled polymer including the annulus area 1314, which is typically filled by polymer flowing from layer 1205 during the process of adhering the capacitive sheet 500, 600 to the layer 1205. The other dielectric layers 1205, 1370, 1371 may be glass reinforced polymer or other dielectric materials suitable for the printed circuit structure. In yet another alternative, the metal layer 1372 may be adhered to the capacitive sheet 500, 600, followed by patterning of the metal layer 1372, after which the capacitive sheet 500, 600 with the patterned metal layer 1372 is adhered to the partially fabricated printed circuit structure. For this alternative approach, the photodielectric material 505 may act as a prepreg layer for the adherence of the metal while the photodielectric material is not fully cured (in which case layer 1205 would not be present), or a prepreg buildup (which would essentially be layer 1205) over the photodielectric material 505 may be used.

Referring to FIG. 14, a combined cross section diagram of another portion 1405 of the multilayer circuit board described with reference to FIG. 13 and a portion of the block diagram of the electronic device 1300 is shown, in accordance with some embodiments of the present invention. The portion 1405 of the multilayer circuit board illustrates the capacitive laminate 510, 605 (i.e., either the capacitive laminate 510 or the capacitive laminate 605) formed in accordance with embodiments of the present invention. The capacitive laminate 510, 605 is used in this portion 1305 of the printed circuit structure as an isolated capacitor. The power supply 1315 provides a DC voltage 1316 that is coupled to a radio frequency (RF) amplifier (AMP) 1420 to supply a portion of the power needed by the RF AMP 1420. The RF AMP 1420 is coupled to the distributed, shared ground 1322 in the same manner as the processor 1320 at a plated through-hole not shown in FIG. 13 or 14. The RF AMP 1420 generates a signal 1421 that is filtered by resistor 1460 and an isolated capacitor formed by electrodes 1450, 1451 that are formed from respective portions of the second metal foil layer 210, 665 and the first metal layer 415, 660. The signal 1421 is connected to the resistor 1460 and to the plated through-hole 1465, by which it is conducted to the electrode 1450 of the isolated capacitor. The filtered signal 1422 is conducted from the resistor 1460 and the electrode 1451 of the capacitor by the plated through-hole 1466, where it is coupled by conductors on the bottom layer of the multilayer printed circuit structure to an input of another circuit (not shown). As described above, the glass reinforced side 505 of the capacitive sheet and the first metal layer 415, 660 are patterned before the capacitive sheet 500, 600 is adhered to the prepreg layer 1205 of the printed circuit structure. By this means an annulus is formed in the first metal layer around plated through-hole 1465 to avoid the undesirable connection of the electrodes 1450, 1451. Another annulus is formed in the first metal foil layer 415, 660 to form and isolate the electrode 1451 from other portions of the first metal foil layer 415, 660. As described above with reference to FIG. 13, other needed annuli were formed before the capacitive sheet 500, 600 was adhered to the printed circuit structure. The second metal foil layer 210, 665 is patterned using standard metal patterning techniques after the capacitive sheet 500, 600 is adhered to the printed circuit structure, removing an annulus of the second metal foil 210, 665 that defines the electrode 1450 and an annulus 1441 to isolate the plated through-hole 1466 from the electrode 1450.

Figure 15:
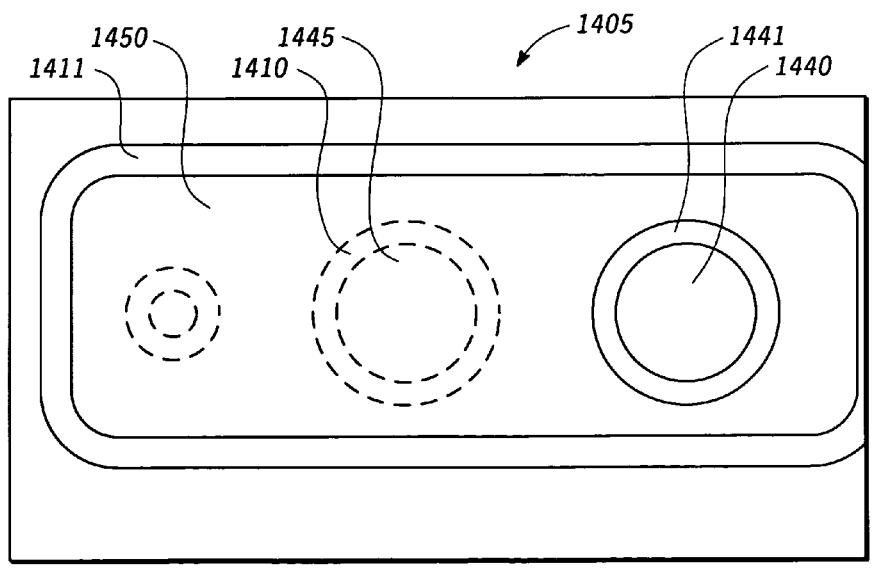
FIG. 15 is a plan view of the portion of the printed circuit structure, shown at the stage where the capacitive laminate has been added to the partially fabricated printed circuit structure and the second metal foil layer and the dielectric layer have been patterned, in accordance with some embodiments of the present invention.

Referring to FIG. 15, a plan view of the portion 1405 of the printed circuit structure is shown at the stage where the capacitive laminate 510, 605 has been added to the partially fabricated printed circuit structure, and the second metal foil layer 210, 665 and the dielectric layer 405, 655 have been patterned. This clarifies the relationship of the annuli to each other and shows an exemplary shape of the isolated capacitor that may be formed by the techniques of the present invention. The plated through-holes 1465, 1466 have not yet been drilled, so there are metal foil circles 1440, 1445 surrounded by the respective annuli 1441, 1410.

It will be appreciated that in some embodiments, the use of a photosensitive polymer that is not glass reinforced may be appropriate.

The electronic device 1300 is representative of any electronic device that can beneficially use embedded capacitors to perform the functions of the electronic device 1300, such as cellular telephones, personal digital managers, toys, appliances, test equipment, controllers, computers, weapons, displays, televisions, etc. All such devices may benefit from the present invention.

Figure 16:
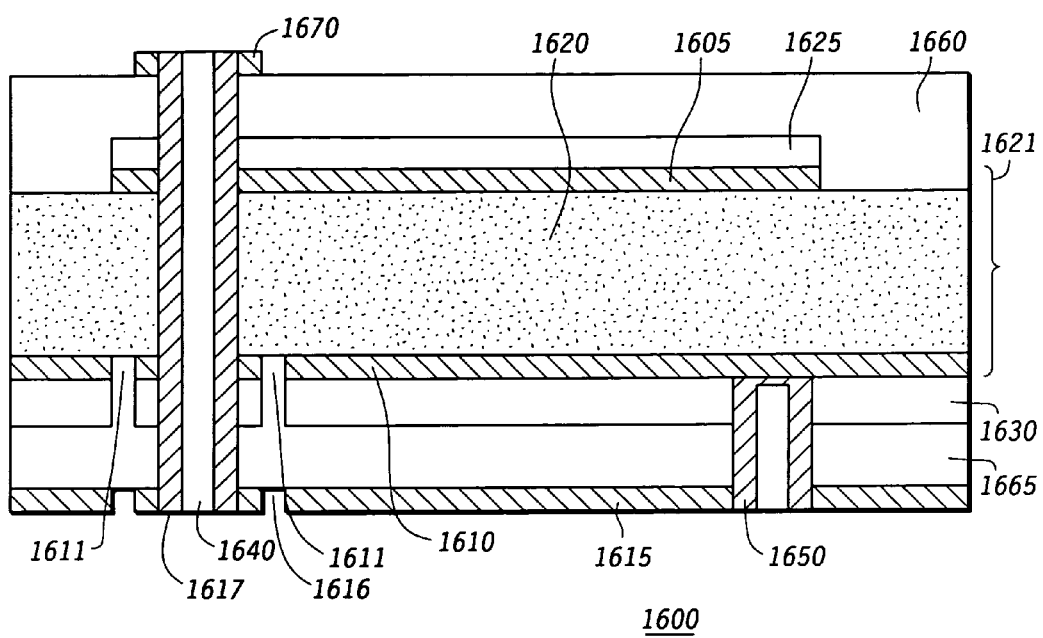
FIG. 16 is a cross section diagram of a patch antenna, in accordance with some embodiments of the present invention.

Referring to FIG. 16, a cross section diagram of a patch antenna 1600 is shown, in accordance with some embodiments of the present invention. Patch antennas are used in many RF communications applications that require very low profile antennas with good RF efficiency, particularly where circular polarization is required (for example, for ground-to-satellite communications). Conventional patch antennas are typically fabricated using printed circuit structure processes, but on substrate materials that provide higher dielectric constant (K) and lower dielectric loss than standard materials such as FR-4. For example, Rogers Corporation of Rogers, Connecticut distributes TMM®-10, which is a low loss polymer loaded with barium titanate powder that achieves a K of 10 and a loss tangent of 0.002 (vs. 4 and 0.04 for FR-4). The higher K allows a more compact antenna, while the lower loss improves radiation efficiency. However, achieving these properties precludes the use of glass weave reinforcement. This, combined with the high ceramic loading, produces a laminate that is relatively weak and brittle, and requires careful handling during processing.

In accordance with the example of the present invention illustrated in FIG. 16, the patch antenna 1600 comprises an antenna active region 1605, a first ground plane 1610, a second ground plane 1615, a dielectric layer 1620, a first photodielectric support layer 1625, a second photodielectric support layer 1630, a first outer foil layer 1660, and a second outer foil layer 1665. The fabrication of the patch antenna 1600 begins with a fabrication of a dielectric laminate 1621 comprising metal foil, the first ground plane 1610 and the dielectric layer 1620. The active antenna region 1605 is formed form the metal foil, which is preferably copper. If the antenna active region has a pattern that is less than the entire foil surface of the dielectric laminate, the pattern may be formed using conventional photolithographic and metal etching techniques. For inexpensive electrical connection, a plated through-hole antenna feedthrough 1640 that couples the antenna active region 1605 to the ground plane side of the patch antenna 1600 is desirable. The second photodielectric support layer 1630 is formed from photosensitive polymer material, and the first photodielectric support layer 1620 may be formed from photosensitive or non-photosensitive polymer material. The first and second photodielectric support layers 1625, 1630 may be formed from glass reinforced photosensitive polymer, using conventional techniques for applying the polymer, on the dielectric laminate 1621. The first and second photodielectric support layers 1625, 1630 provide strength to the otherwise brittle dielectric laminate 1621 during subsequent fabrication steps and allow patterning of the antenna active region 1605 and first ground plane 1610, using standard photolithography and metal etching techniques. During this patterning, an annulus 1611 is formed in the first ground plane 1610. Then the first and second outer foil layers 1660, 1665 are adhered to the exposed surfaces of the dielectric 1620 and the first and second photodielectric support layers 1625, 1630. The first and second outer foil layers 1660, 1665 comprise prepreg plus foil or resin coated foil, and are adhered using conventional techniques. An annulus 1616 may be formed in the second ground plane 1615 from the metal foil of the second outer foil layer 1665 and the metal foil of the first outer layer 1660 may be patterned to provide a circular pad 1670, using standard photolithography and metal etching techniques, allowing the plated through-hole antenna feed through 1640 to be drilled and plated. A blind plated hole 1650 is also formed to couple the first and second ground planes 1610, 1615 Pins or cables are soldered to the plated through-hole antenna feedthrough pad 1617 and the ground plane 1615 to connect the antenna to a separate electronics assembly. In some embodiments, for example those in which the antenna active region 1605 covers the entire surface of the dielectric laminate 1621, the first photodielectric support layer 1625 and the first outer foil layer 1660 may not be needed. In other embodiments, non-glass reinforced polymer may be used for one or more of the first and second photodielectric support layers 1625, 1630, and the first and second outer foil layers 1660, 1665.

It will be appreciated that there are some common characteristics of the patch antenna 1600 and the electronic device 1300 described above. While the electronic device 1600 and the capacitive sheets 500, 600 have been described as comprising a capacitive laminate 510, 605, it will be appreciated that the capacitive laminate 510, 605 could alternatively be described as a dielectric laminate 510, 605. Also, it will be appreciated that the capacitive sheets 500, 600 could alternatively be described as a dielectric sheets 500, 600. Furthermore, the first and second ground planes of the patch antenna 1600 could alternatively be described as metal foil layers. Thus the electronic device 1300 and patch antenna 1600 could both be described as comprising a dielectric sheet that comprises a photodielectric support layer and a dielectric laminate, the dielectric laminate comprising first and second metal foil layers and a dielectric layer disposed between the first and second metal foil layers, wherein the first metal foil layer is adhered to the photodielectric support layer.

By now it should be appreciated that the capacitive (or dielectric) sheets 500, 600 provide an economical and reliable means to add embedded capacitors of high capacitive density to flexible and rigid circuit boards, either as shared capacitance or as isolated capacitance, and to form patch antennas. The photodielectric support layer gives a strength to the capacitive sheet that allows normal handling and means to pattern the bottom layer of the capacitive sheet (the layer that is adhered to the partially fabricated multilayer board) using conventional printed circuit processing techniques. For example, the terminal of an integrated circuit could be located directly atop the terminal for the top electrode of an isolated capacitor and another terminal of the same integrated circuit could be located directly atop a terminal coupled to the bottom electrode of the isolated capacitor, in a situation in which the separation of the terminals of the integrated circuit is essentially equal to one side of a capacitor that is square. In such an example, an integrated circuit that is 15 millimeters wide might have a capacitor of the present invention that is approximately 225 square millimeters and that provides on the order of 0.6 micro farads essentially directly coupled to two terminals of the integrated circuit located 15 millimeters apart on opposite side of the integrated circuit. The total length of the conductors between the integrated circuit and the capacitor could be less than 100 microns. Alternatively, ten bypass or decoupling capacitors of value greater than 0.01 microfarad could be coupled to two terminals of an IC using similar extremely short total conductive lengths.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The terms "including" and/or "having", as used herein, are defined as comprising. The term "coupled", as used herein with reference to electro-optical technology, is defined as connected, although not necessarily directly, and not necessarily mechanically.

What is claimed is:

1. A dielectric sheet, comprising:
   a photodielectric support layer; and
   a dielectric laminate, comprising
      first and second metal foil layers, and
      a dielectric layer disposed between the first and second metal foil layers, wherein the
      first metal foil layer is adhered to the photodielectric support layer, and wherein the
      photodielectric support layer is a glass reinforced photodielectric layer.

2. The dielectric sheet according to claim 1, wherein the dielectric layer comprises a crystallized dielectric oxide layer less than 1 micron thick.

3. The dielectric sheet according to claim 2, wherein the dielectric layer comprises a crystallized lead calcium zirconate titanate material having a capacitive density of greater than 1000 $pF/mm^2$.

4. The dielectric sheet according to claim 2, wherein the crystallized dielectric oxide layer is formed from a dielectric oxide that contains lead.

5. The dielectric sheet according to claim 1, wherein the dielectric layer comprises a polymer material filled with ceramic dielectric having a capacitive density of greater than 3 $pF/mm^2$.

6. The dielectric sheet according to claim 1, wherein: the first and second metal foil layers are each between 5 and 25 microns thick; and the photodielectric support layer is less than 260 microns thick.

7. The dielectric sheet according to claim 1, wherein the first and second metal foil layers each comprise a metal selected from a group consisting of copper, copper alloys, nickel, and nickel alloys.

8. The dielectric sheet according to claim 1, further comprising a second photodielectric support layer comprising polymer material that is adhered to the second metal foil layer.

9. A printed circuit structure, comprising:
   a dielectric sheet, comprising
      a photodielectric support layer that is glass reinforced, and
      a capacitive laminate, comprising
         first and second metal foil layers, and
         a dielectric layer disposed between the first and second metal foil layers, wherein the first metal foil layer is adhered to the photodielectric support layer; and a printed circuit sub-structure.

10. The printed circuit structure according to claim 9, wherein the first metal foil layer is patterned by removal of metal according to a circuit pattern and the photodielectric support layer is patterned by removal of dielectric material according to the circuit pattern.

11. The capacitive sheet according to claim 9, wherein the dielectric layer comprises a crystallized dielectric oxide layer less than 1 micron thick.

12. The printed circuit structure according to claim 9, further comprising at least one electronic component electrically connected to a portion of at least one of the first and second metal foil layers.

* * * * *